(12) United States Patent
Miller

(10) Patent No.: US 7,557,592 B2
(45) Date of Patent: Jul. 7, 2009

(54) METHOD OF EXPANDING TESTER DRIVE AND MEASUREMENT CAPABILITY

(75) Inventor: Charles A. Miller, Fremont, CA (US)

(73) Assignee: FormFactor, Inc., Livermore, CA (US)

( * ) Notice: Subject to any disclaimer, the term of this patent is extended or adjusted under 35 U.S.C. 154(b) by 80 days.

(21) Appl. No.: 11/422,573

(22) Filed: Jun. 6, 2006

(65) Prior Publication Data

US 2007/0296422 A1 Dec. 27, 2007

(51) Int. Cl.
*G01R 31/02* (2006.01)
*G01R 31/26* (2006.01)
(52) U.S. Cl. ........................ 324/754; 324/765
(58) Field of Classification Search .......... 324/754–765
See application file for complete search history.

(56) References Cited

U.S. PATENT DOCUMENTS

| | | | |
|---|---|---|---|
| 6,518,779 B1 | 2/2003 | Nakata et al. | |
| 6,788,090 B2* | 9/2004 | Aihara | 324/765 |
| 6,798,225 B2* | 9/2004 | Miller | 324/754 |
| 6,812,691 B2 | 11/2004 | Miller | |
| 2006/0028225 A1 | 2/2006 | Von Appen | |
| 2006/0061374 A1* | 3/2006 | Shinozaki et al. | 324/754 |
| 2007/0247175 A1* | 10/2007 | Khandros et al. | 324/754 |

OTHER PUBLICATIONS

PCT/US2007/69798: International Search Report and Written Opinion of the International Searching Authority, May 25, 2007.
Int'l Preliminary Report On Patentability, PCT application PCT/US/2007/069798 (Jan. 22, 2009), 6 pages.

* cited by examiner

*Primary Examiner*—Ha Tran T Nguyen
*Assistant Examiner*—Emily Y Chan
(74) *Attorney, Agent, or Firm*—N. Kenneth Burraston

(57) ABSTRACT

A probe card assembly can comprise an interface, which can be configured to receive from a tester test signals for testing an electronic device. The probe card assembly can further comprise probes for contacting the electronic device and electronic driver circuits for driving the test signals to ones of the probes.

18 Claims, 13 Drawing Sheets

METHOD OF EXPANDING TESTER DRIVE AND MEASUREMENT CAPABILITY

BACKGROUND

Test systems for testing one or more electronic devices are known. For example, test systems are known for testing semiconductor dies. Such test systems can provide test data to the electronic device or devices and then evaluate a response of the electronic device or devices to the test data. Various types of tests can be performed on electronic devices. Examples of such tests include DC tests and functional tests.

Direct current ("DC") tests typically involve measuring one or more DC characteristics of an electronic device. For example, a DC test can measure the leakage current of terminals (e.g., bond pads) of a semiconductor die. Other examples of DC tests commonly performed on a semiconductor die include without limitation testing for an open circuit fault at a terminal and testing for a short circuit fault at a terminal.

Functional testing typically involves operating the electronic device. Functional testing can be limited to partial operation of the device. For example, in some test situations, testing of an electronic device is performed over less than the full operational spectrum of the electronic device. For example, only selected functions of the electronic device are tested, and/or the electronic device is tested at less than its full operating speed. In some test situations, it is desired to perform functional tests over a full operational spectrum of the electronic device or to perform tests at full operational speed of the device.

SUMMARY

In some embodiments of the invention, a probe card assembly can comprise an interface, which can be configured to receive from a tester test signals for testing an electronic device. The probe card assembly can further comprise probes for contacting the electronic device and electronic driver circuits for driving the test signals to the probes.

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, as the term "on" is used herein, one object (e.g., a material, a layer, a substrate, etc.) can be "on" another object regardless of whether the one object is directly on the other object or there are one or more intervening objects between the one object and the other object. Also, directions (e.g., "x," "y, "z," above, below, top, bottom, side, etc.), if provided, are relative and provided solely by way of example and for ease of illustration and discussion and not by way of limitation.

Figure 1:
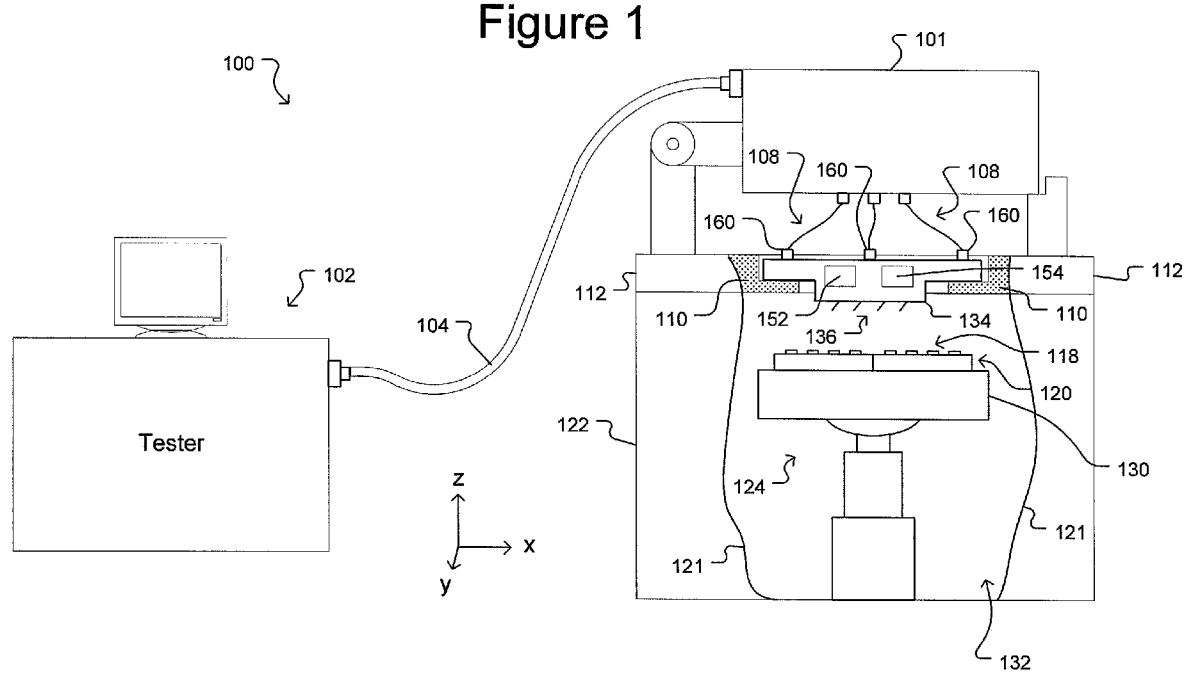
FIG. 1 illustrates an exemplary test system according to some embodiments of the invention.

FIG. 1 illustrates an exemplary test system 100 configured to test a plurality of electronic devices according to some embodiments of the invention. The electronic devices to be tested can comprise semiconductor dies of an unsingulated semiconductor wafer, semiconductor dies singulated from a wafer (packaged or unpackaged), one or more arrays of singulated dies disposed in a carrier or other holding device, multi-die electronics modules, printed circuit boards, or any other type of electronic devices. (Hereinafter the electronic devices being tested, whatever the type, are referred to as devices under test or "DUTs".)

As shown, the test system 100 can comprise a tester 102 configured to control testing of the DUTs 120. Tester 102, which can comprise one or more computers, can generate test data that is input into DUTs 120 and receive response data output by the DUTs 120 in response to the test data. Tester 102 can evaluate the response data to determine whether the DUTs 120 pass the testing and/or to rate the DUTs 120.

As also shown in FIG. 1, the test system 100 can include a prober 122, which can be a box structure with an interior chamber 132 in which is disposed a movable chuck 124 having a stage 130 for holding DUT 120. (Cut out 121 provides a partial view into chamber 132.) Chuck 124 can be capable of moving in the "x," "y," and "z" directions, and may also be capable of tilting about the "x" and "y" axes and rotating about the "z" axis. The prober 122 can include a head plate 112, which can be a solid, rigid plate structure. The head plate 112 can include an insert ring 110 to which a probe card assembly 134 comprising a plurality of probes 136 can be mounted (e.g., bolted). In use, the movable chuck 124 can align terminals 118 of DUTs 120 with probes 136. The chuck 124 can then move the terminals 118 into contact with probes 136 and thereby create electrical connections between the probes 136 and the terminals 118 of DUTs 120. Terminals 118 can include input terminals, output terminals, power terminals, ground terminals, and other terminals.

Probes 136 can be resilient, conductive structures. Non-limiting examples of suitable probes 136 include composite structures formed of a core wire bonded to a conductive terminal (not shown) on probe card assembly 134 that is over coated with a resilient material as described in U.S. Pat. Nos. 5,476,211, 5,917,707, and 6,336,269. Probes 136 can alternatively be lithographically formed structures, such as the spring elements disclosed in U.S. Pat. Nos. 5,994,152, 6,033,935, 6,255,126, 6,945,827, U.S. Patent Application Publication No. 2001/0044225, and U.S. Patent Application Publication No. 2004/0016119. Still other non-limiting examples of probes 136 are disclosed in U.S. Pat. Nos. 6,827,584, 6,640,432, 6,441,315, and U.S. Patent Application Publication No. 2001/0012739. Other non-limiting examples of probes 136 include electrically conductive pogo pins, bumps, studs, stamped springs, needles, buckling beams, etc.

Communications cable 104, test head 101, and electrical connections 108 (e.g., wires, electrically conductive pogo pins, etc.) can provide a plurality of communications channels 180 (see FIG. 2) between tester 102 and probe card assembly 134. As will be seen, the communications channels 180 can provide data paths for data (e.g., test data, control data, etc.) to be provided from tester 102 to probe card assembly 134 and for data (e.g., response data output by DUTs 120, control data, status data, etc.) to be provided from probe card assembly 134 to tester 102. Power and ground, among other electrical signals, can also be provided through communications channels 180 provided by communications cable 104, test head 101, and connections 108. Communications cable 104 can be replaced with other means of communicating data, such as wireless communications equipment.

Figure 2:
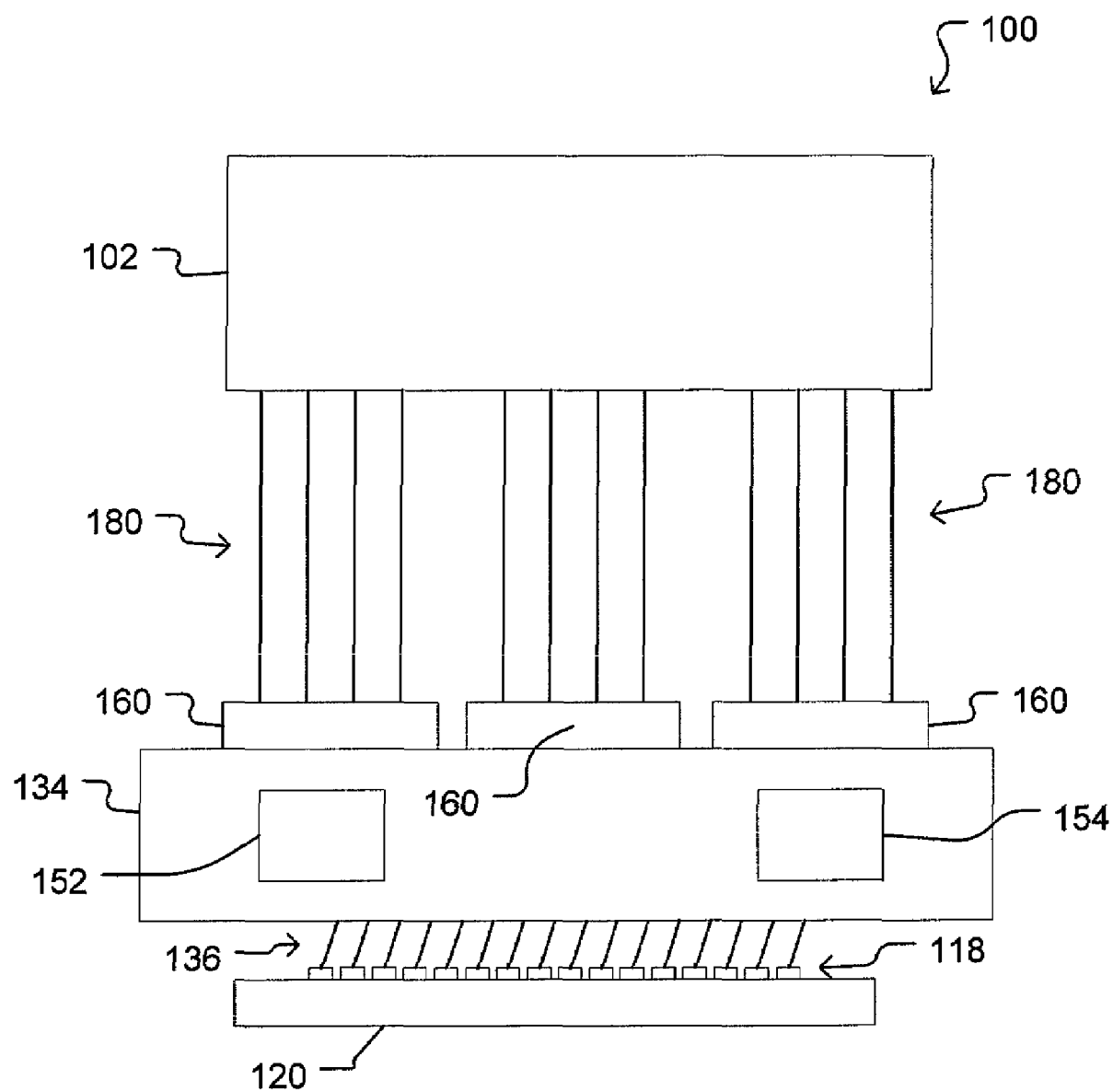
FIG. 2 illustrates a simplified block diagram of the test system of FIG. 1.

As shown in FIG. 2, the communications channels 180 can be connected to electrical connectors 160 on probe card assembly 134. Connectors 160 can provide an electrical interface to the communications channels 180. Connectors 160 can be any electrical component for making electrical connections with connections 108 from test head 101. (See FIG. 1.) For example, if connections 108 are electrically conductive pogo pins, connectors 160 can be pads against which the pogo pins can be pressed to form electrical connections between the pogo pins and the pads. As another example, connections 108 can comprise zero-insertion-force ("ZIF") electrical connectors, and connectors 160 can likewise comprise compatible ZIF connectors.

As will be seen, communications channels 180 configured to provide test data from tester 102 to DUTs 120 can be connected to a shared drivers block 152, which can be configured to electrically connect one such communications channel 180 to a plurality of probes 136 configured to contact input terminals 118 of DUTs 120. Shared drivers block 152 can thus be configured to receive from tester 102 test data generated to test one DUT 120 and provide that test data to a plurality of DUTs 120. Communications channels 180 configured to provide response data output by DUTs 120 in response to the test data can be electrically connected to others of probes 136 (e.g., probes configured to contact output terminals 118 of DUTs 120). Moreover, a power supplies block 154, which as will be seen, can be configured to provide power to DUTs 120, can be electrically connected to still others of probes 136 (e.g., probes 136 configured to contact power and ground terminals 118 of DUTs 120).

As mentioned above, shared drivers block 152 can receive from tester 102 test data for testing a first number "N" of DUTs 120 and provide that test data to a second, greater number "M" of DUTs 120. For example, M may be an integer (e.g., two, three, four, five, ten, twenty, fifty, or more or any number in between) multiple of N. Shared drivers block 152 can thus expand the test capability of tester 102 such that more DUTs 120 are tested within prober 122 than tester 102 is designed to test. As also mentioned above, power supplies block 154 can provide power to "M" DUTs 120 and can also allow for DC testing of DUTs 120.

Figure 3:
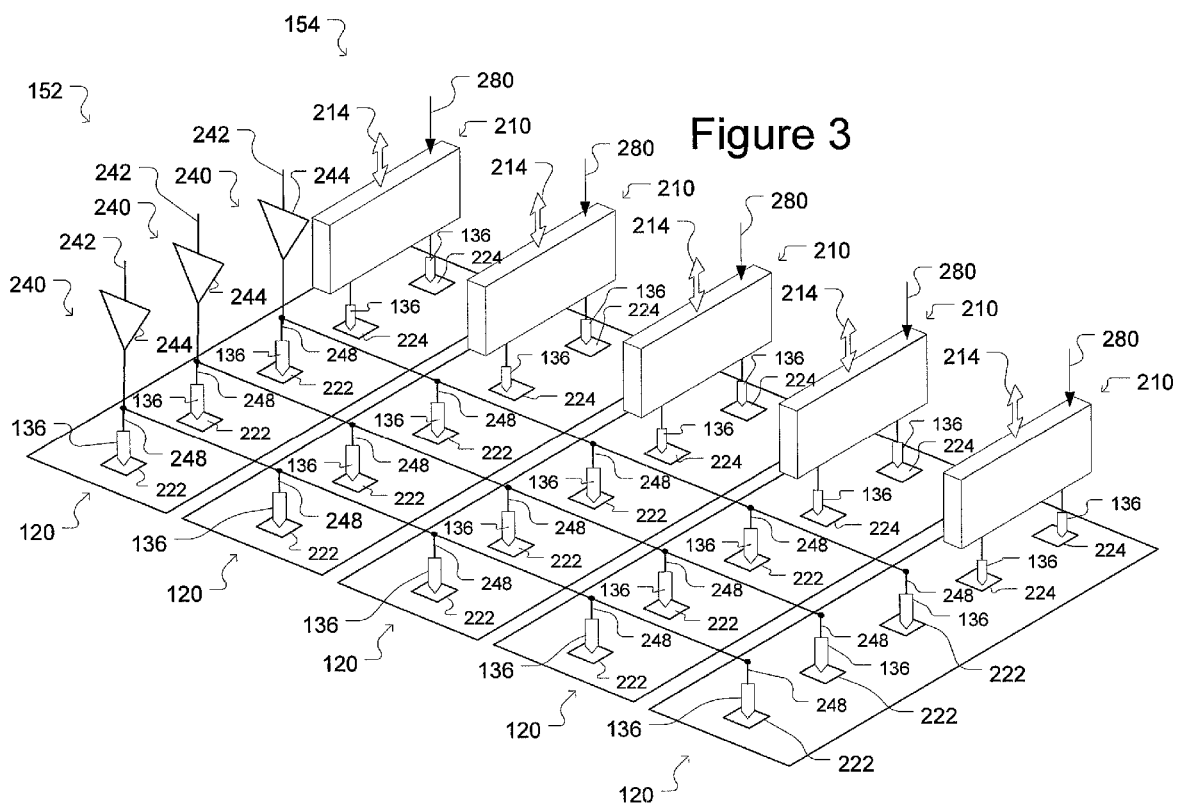
FIG. 3 illustrates exemplary configurations of the shared drivers block and the power supplies block of the test system of FIG. 1 according to some embodiments of the invention.

FIG. 3 illustrates exemplary configurations of a shared drivers block 152 and a power supplies block 154 according to some embodiments of the invention. Also shown in FIG. 3 are partial views of five DUTs 120 that are to be tested using shared drivers block 152 and power supplies block 154. In the partial views of DUTs 120 shown in FIG. 3, three of terminals 118 can be input terminals 222 and two of terminals 118 can be power terminals 224. Input terminals 222 and power terminals 224 can be subsets of the terminals 118 (see FIGS. 1 and 2) on each DUT 120. That is, each DUT 120 can have additional terminals (not shown in FIG. 3), including output terminals and additional input terminals and additional power terminals.

As shown, the exemplary configuration of shared drivers block 152 shown in FIG. 3 can include three shared driver modules 240, one for each input terminal 222 on each DUT 120. In other configurations of shared drivers block 152, more or fewer shared driver modules 240 can be included. In some configurations, one shared driver module 240 can be provided for each input terminal on a DUT 120 being tested.

As also shown, the exemplary configuration of power supplies block 154 shown in FIG. 3 can include five power supply modules 210. In other configurations of power supplies block 154 more or fewer power supply modules 210 can be included, and in some configurations, one power supply module 210 can be provided for each DUT 120 being tested.

Figure 4:
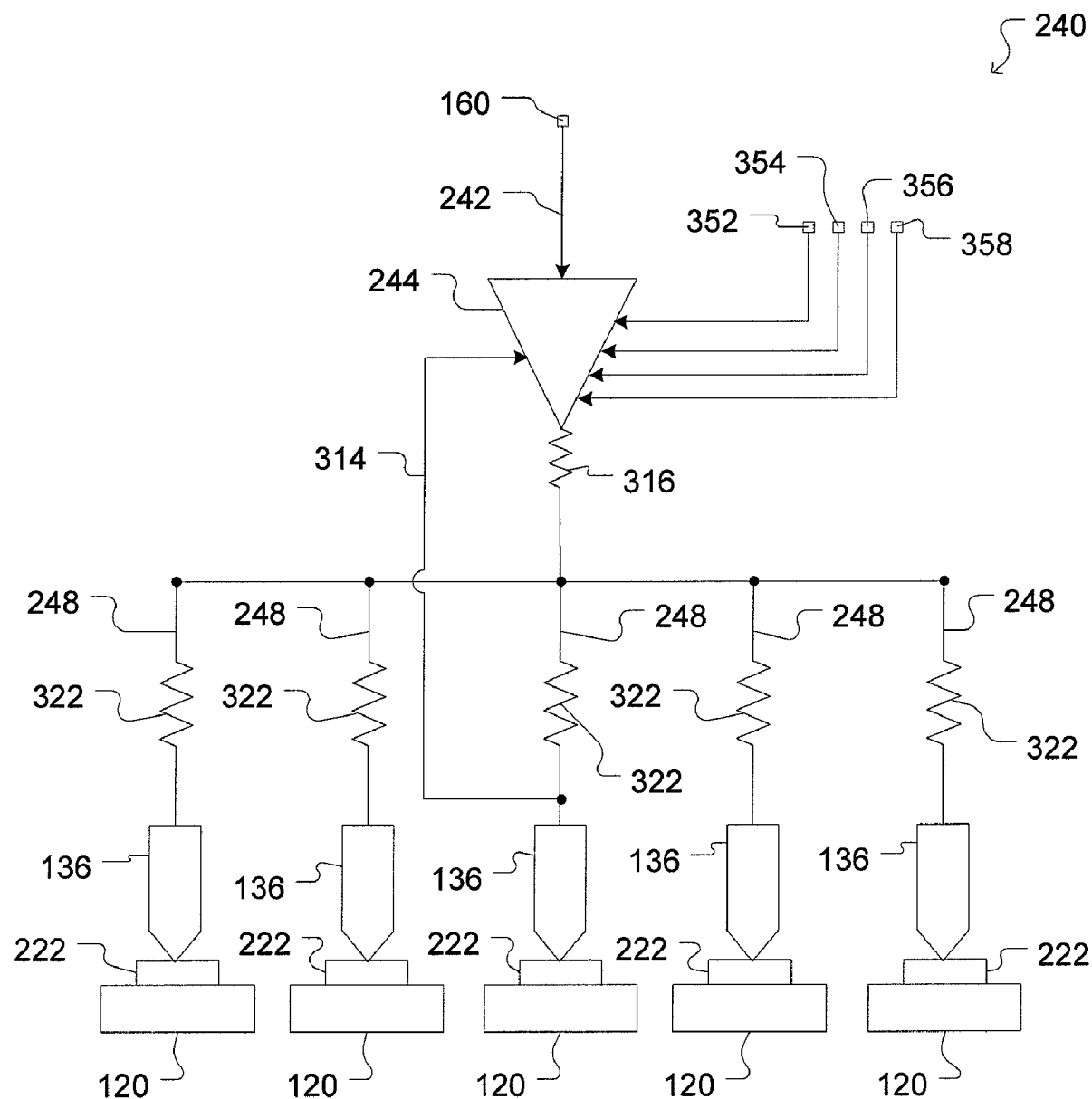
FIGS. 4-6 illustrate exemplary configurations of a shared driver module according to some embodiments of the invention.

FIG. 4 illustrates an exemplary configuration of a shared driver module 240 according to some embodiments of the invention. As shown, each shared driver module 240 can comprise a driver circuit 244. An input 242 of the driver circuit 244 can be connected through connector 160 to a communications channel 180 from tester 102 (see FIG. 2), and the driver circuit 244 can drive signals received through input 242 down multiple transmission lines 248 to multiple probes 136 in contact with input terminals 222 of multiple DUTs 120. Each shared driver block 240 can thus receive test data from one communications channel 180 and distribute that test data to a plurality of DUTs 120. In the example shown in FIG. 4, such test data received via an input 242 is distributed to five DUTs 120, but such test data can be distributed to more or fewer than five DUTs by, for example, configuring driver 244 to drive more or fewer transmission lines 248.

Still referring to FIG. 4, a plurality of control signals 352, 354, 356, 358 (four are shown but more or fewer can be used) can be provided to control operation of driver 244. One such control signal can be a timing control signal 352, which can control the timing of driver 244. For example, timing control signal 352 can trigger the output of a signal from driver 244 onto transmission lines 248. Timing control signal 352 can be any suitable signal. For example, timing control signal 352 can simply activate (e.g., enable) output of driver 244. As another example, timing control signal 352 can represent a delay from a specified event (e.g., a feature, such as a rising edge or falling edge, of a master clock signal (not shown)). Other exemplary control signals can include voltage high control signal 354 and voltage low control signal 356, which can specify, respectively, the voltage level of a logic high signal output by driver 244 and the voltage level of a logic low signal output by driver 244. ("High" and "low" refer to the two possible levels of a digital signal.) Control signal 358 represents other miscellaneous control signals that can be provided to driver 244.

Timing control signal 352, high control signal 354, low control signal 356, and other control signals 358 can be generated by tester 102 and provided to driver 244 through communications channels 180. Alternatively, one or more of timing control signal 352, high control signal 354, low control signal 356, and other control signals 358 can correspond to digital data stored in a memory (not shown) disposed on probe card assembly 134. Prior to testing DUTs 120, the tester 102 can write control data to the memory (not shown) using one or more of communications channels 180. Alternatively, the control data can be written into the memory (not shown) from a source other than the tester 102.

As is known, a fault at an input terminal 222 can cause the voltage to drop along the transmission line 248 leading to the terminal 222 with the fault. As shown in FIG. 4, a feed back control loop 314 can monitor the voltage along one or more of the transmission lines 248 and can provide feed back to the driver 244. (Although only one loop 314 is shown in FIG. 4 (and FIGS. 5 and 6), a feed back control loop 314 can be provided from each transmission line 248 to the driver 244.) Driver 244 can be configured to increase the voltage level of signals driven onto transmissions lines 248 if the voltage level fed back to driver 244 drops below a predetermined level. Additional information regarding exemplary implementations of such feed back control loops, which can be implemented in feed back control loop 314, is disclosed in U.S. Pat. No. 6,812,691.

Isolation resistors 322 can provide a measure of electrical isolation between the probes 136, which are driven by the same driver 244 and thus are electrically connected to each other. For example, if one of the five probes 136 shown in FIG. 4 contacts a DUT input terminal 222 that has a short-to-ground fault (i.e., the terminal 222 is shorted to ground), all of the probes 136 shown in FIG. 4 could tend to be pulled toward ground because all of the probes 136 are electrically connected to each other. Thus, a short-to-ground fault on only one of the DUTs 120 contacted by the five probes 136 shown in FIG. 4 could register ground level voltages on all five of the probes 136, causing all five of the DUTs 120 contacted by the five probes 136 to test as bad when, in fact, only one of the DUTs 120 is bad. Because the isolation resistors 322 provide a measure of electrical isolation for each probe 136, isolation resistors 322, can prevent a short-to-ground fault, among other faults, at one probe 136 from adversely affecting the other probes 136. The proper size of resistors 322 can depend on the system and the voltage levels used in the system.

Generally speaking, resistors 322 should be sized such that, if one of probes 136 contacts a terminal 222 that is shorted to ground while driver 244 is outputting a high logic level, the other probes 136 maintain a voltage sufficient to be deemed a high logic level voltage in accordance with the specifications of the system. As is known, the isolation resistors 322 should also be sized to provide impedance matching (e.g., with the output impedance 316 of the driver 244) in the shared driver module 240 in accordance with generally well known behaviors of transmission lines. Generally speaking, the greater the number of transmission lines 248 driven by one driver 244, however, the greater the resistance required of each isolation resistor 322 to achieve impedance matching with the output impedance 316 of the driver 244.

The larger the resistance of each resistor 322, however, the lower the frequency response at the terminals 222 of the DUTs 120. That is, the larger the resistance of resistors 322, the lower the frequency at which test signals can be provided to the DUTs 120 through the shared driver module 240. This is particularly true for DUTs 120 made using complimentary metal oxide semiconductor ("CMOS") technology or similar technologies. As is known, an input terminal 222 of a CMOS DUT 120 can be modeled electronically, in simplified fashion, as a capacitor. Thus, with each probe 136 in contact with a terminal 222 of a CMOS DUT 120, the rise time (which is relevant to the time required to switch the terminal 222 from a low logic level to a high logic level), the fall time (which is relevant to the time required to switch the terminal 222 from a high logic level to a low logic level), and the frequency response of each transmission line 248 are all affected by the value of each isolation resistor 322. Thus, the greater the resistance of an isolation resistor 322, the greater the rise time required to switch a CMOS terminal 222 from low logic to high logic, the greater the fall time required to switch a CMOS terminal 222 from high logic to low logic, and the smaller the cut off frequency of the filter formed by the isolation resistor 322 in series with the capacitance (not shown) of the CMOS terminal 222. Thus, the smaller the resistance of each isolation resistor 322, the greater the frequency response of the shared driver module 240. In other words, the smaller the resistance R of each isolation resistor 322, the higher the frequency at which DUTs 120 can be tested.

If the effective total resistance of the isolation resistors 322 is to equal or approximately equal the output impedance 316 of driver 244, then the following equation can govern selection of the resistance of isolation resistors 322: $R=R_o*N$, wherein R is the resistance value of each isolation resistor 322, $R_o$ is the output impedance 316 of the driver 244, N is the total number of isolation resistors 322 driven by the driver 244, and * means multiplication. The resistance R of each isolation resistors 322 can therefore be equal to (or approximately equal to) the product of the output impedance $R_o$ 316 of driver 244 and the total number N of isolation resistors 322.

Thus, if the output impedance 316 of driver 244 is 50 ohms, then the resistance R of each isolation resistor 322 is as follows:

| N | R |
|---|---|
| 2 | 100 Ω |
| 4 | 200 Ω |
| 6 | 300 Ω |
| 8 | 400 Ω |
| 10 | 500 Ω |
| 20 | 1000 Ω |
| 50 | 2500 Ω |

As can be seen, the resistance R of each isolation resistor 322 increases significantly as the number N of resistors 322 driven by the driver 244 increases. There is, of course, a corresponding increase in the rise times and fall times and a corresponding decrease in the cut off frequency of the low pass filter formed by each isolation resistor 322 and the capacitance of the terminal 222 to which a probe 136 is electrically connected. Thus, the frequency response of the configuration shown in FIG. 4 falls off considerably as the number of transmission lines 248 and thus the number N of isolation resistors 322 increases. Note that N refers not only to the number of isolation resistors 322 but can also refer to the number of transmission lines 248 driver by a driver 244 and thus to the number of DUTs 120 that can be tested using test data generated by the tester 102 (see FIGS. 1 and 2) for one DUT.

By selecting a smaller value for the output impedance 316 of driver 244, the frequency response of probe card 134 can be improved even while increasing the number of transmission lines 248 driven by a driver 244 and therefore the number of DUTs 120 that can be tested in parallel using test data generated by the tester 102 (see FIGS. 1 and 2) to test one DUT. For example, if the output impedance 316 of driver 244 is reduced from 50 ohms to 30 ohms, then the resistance value R of each isolation resistor 322 can be as follows:

| N | R |
|---|---|
| 2 | 60 Ω |
| 4 | 120 Ω |
| 6 | 180 Ω |
| 8 | 240 Ω |
| 10 | 300 Ω |
| 20 | 600 Ω |
| 50 | 1500 Ω |

As another example, if the output impedance 316 of driver 244 is further reduced to 20 ohms, then the resistance value R of each isolation resistor 322 can be as follows:

| N | R |
|---|---|
| 2 | 40 Ω |
| 4 | 80 Ω |
| 6 | 120 Ω |
| 8 | 160 Ω |
| 10 | 200 Ω |
| 20 | 400 Ω |
| 50 | 1000 Ω |

As still another example, if the output impedance 316 of driver 244 is 10 ohms, then the resistance value R of each isolation resistor 322 can be as follows:

| N | R |
|---|---|
| 2 | 20 Ω |
| 4 | 40 Ω |
| 6 | 60 Ω |
| 8 | 80 Ω |
| 10 | 100 Ω |
| 20 | 200 Ω |
| 50 | 500 Ω |

As yet another example, if the output impedance 316 of driver 244 (is further reduced to 5 ohms, then the resistance value R of each isolation resistor 322 can be as follows:

| N | R |
|---|---|
| 2 | 10 Ω |
| 4 | 20 Ω |
| 6 | 30 Ω |
| 8 | 40 Ω |
| 10 | 50 Ω |
| 20 | 100 Ω |
| 50 | 250 Ω |

As still another example, if the output impedance 316 of driver 244 is further reduced to 1 ohms, then the resistance value R of each isolation resistor 322 can be as follows:

| N | R |
|---|---|
| 2 | 2 Ω |
| 4 | 4 Ω |
| 6 | 6 Ω |
| 8 | 8 Ω |
| 10 | 10 Ω |
| 20 | 20 Ω |
| 50 | 50 Ω |

As can be seen, by reducing the output impedance 316 of driver 244, the resistance R of isolation resistors 322 can be reduced while still matching or approximately matching the total effective resistance of isolation resistors 322 with the impedance 316 of driver 244. And because the rise time and fall time of the series resistor-capacitor circuit formed by each isolation resistor 322 and a capacitance of the DUT 120 terminal 222 is proportional to the product of the resistance R of the isolation resistor 322 and capacitance of the input terminal 222 of the DUT 120, reducing the resistance R of the isolation resistors 322 decreases the rise times and fall times, which in turn increases the frequency at which signals can be input into the DUTs 120. Thus, reducing the output impedance 316 of driver 244, increases the frequency at which test data can be provided through the shared driver module 240 to the DUTs 120.

It should be noted that, as shown in FIGS. 1 and 2, the shared driver module 240 can be located on a probe card assembly 134. Drivers 244 can thus be located close to probes 136. For example, the drivers 244 can typically be located at least within twelve inches and often closer (e.g., ten inches, eight inches, six inches, four inches, two inches, or even closer) to probes 136. Indeed, the distance of drivers 244 from probes 136 can be insignificant compared to the length of communications channels 180, which can increase the frequency at which signals can be driven by driver 244 to probes 136.

If the drivers 244 are located sufficiently close to the probes 136, as will typically be the case where the drivers 244 are located on the probe card assembly to which the probes are attached, the characteristic impedances $Z_c$ of the transmission lines 248 can be ignored and the output impedance 316 of the driver 244 can be sized relative to the isolation resistors 322 as generally discussed above. Thus, ignoring the characteristic impedances $Z_c$ of the transmission lines 248 in FIG. 4, the output impedance 316 of the driver 244 can be made or selected to be as follows: $R_o = R/N$, where $R_o$ is the output impedance 316 of the driver 244, R is the resistance value of each isolation resistor 322, N is the total number of isolation resistors 322, and * means multiplication. (The foregoing assumes that the resistance value of each isolation resistor 322 is the same or approximately the same.) The output impedance 316 of the driver 244 can therefore be made or selected to be the resistance value of one of the isolation resistors 322 divided by the number of isolation resistors.

As mentioned, the foregoing calculations are based on the assumption that the effects of the characteristic impedances $Z_c$ of the transmission lines 248 on the signals driven by driver 244 down transmission lines 248 are sufficiently negligible to ignore. Generally speaking, the effects of the characteristic impedances $Z_c$ of the transmission lines 248 on the quality and integrity of the signals driven down the transmission lines are negligible if the length of the longest signal path between the driver 244 and each probe 136 driven by the driver 244 is less than about one tenth of the length of the wavelength corresponding to the maximum frequency at which the driver 244 drives signals down the transmission lines 248 to the probes 136. In other words, as long as the ratio of the wavelength corresponding to the maximum operating frequency of the shared driver module 240 to the longest signal path from the driver 244 to the probes 136 driven by the driver 244 is at least about ten, the characteristic impedances $Z_c$ of the transmission lines 248 will not appreciably affect the signals, and the characteristic impedances $Z_c$ of the transmission lines 248 can be ignored with little to no signal degradation. If some signal degradation can be tolerated, the characteristic impedances $Z_c$ of the transmission lines 248 can be ignored even for smaller ratios of the wavelength corresponding to the maximum operating frequency of the shared driver module 240 to the longest signal path from the driver 244 to the probes 136. For example, depending on the tolerance for signal degradation in a particular system, the characteristic impedances $Z_c$ of the transmission lines 248 can be ignored for ratios of five or even less than five.

Thus, by operating the shared driver modules 240 at frequencies whose wavelengths are at least a threshold multiple of the length of a signal path between the driver 244 and the probes 136, one can ignore the effects of the characteristic impedances $Z_c$ of the transmission lines 248. The threshold can depend on the desired quality of the signals on the transmission lines 248 and at the probes 136. Non-limiting examples of the thresholds include five, ten, fifteen, twenty, thirty, forty, and fifty. The configuration of the shared driver module 240 shown in FIG. 4 and discussed above is an example of a configuration in which the effects of the characteristic impedances $Z_c$ of the transmission lines 248 is ignored in selecting the output impedance 316 of the driver 244 and the resistance values of the isolation resistors 322.

Figure 5:
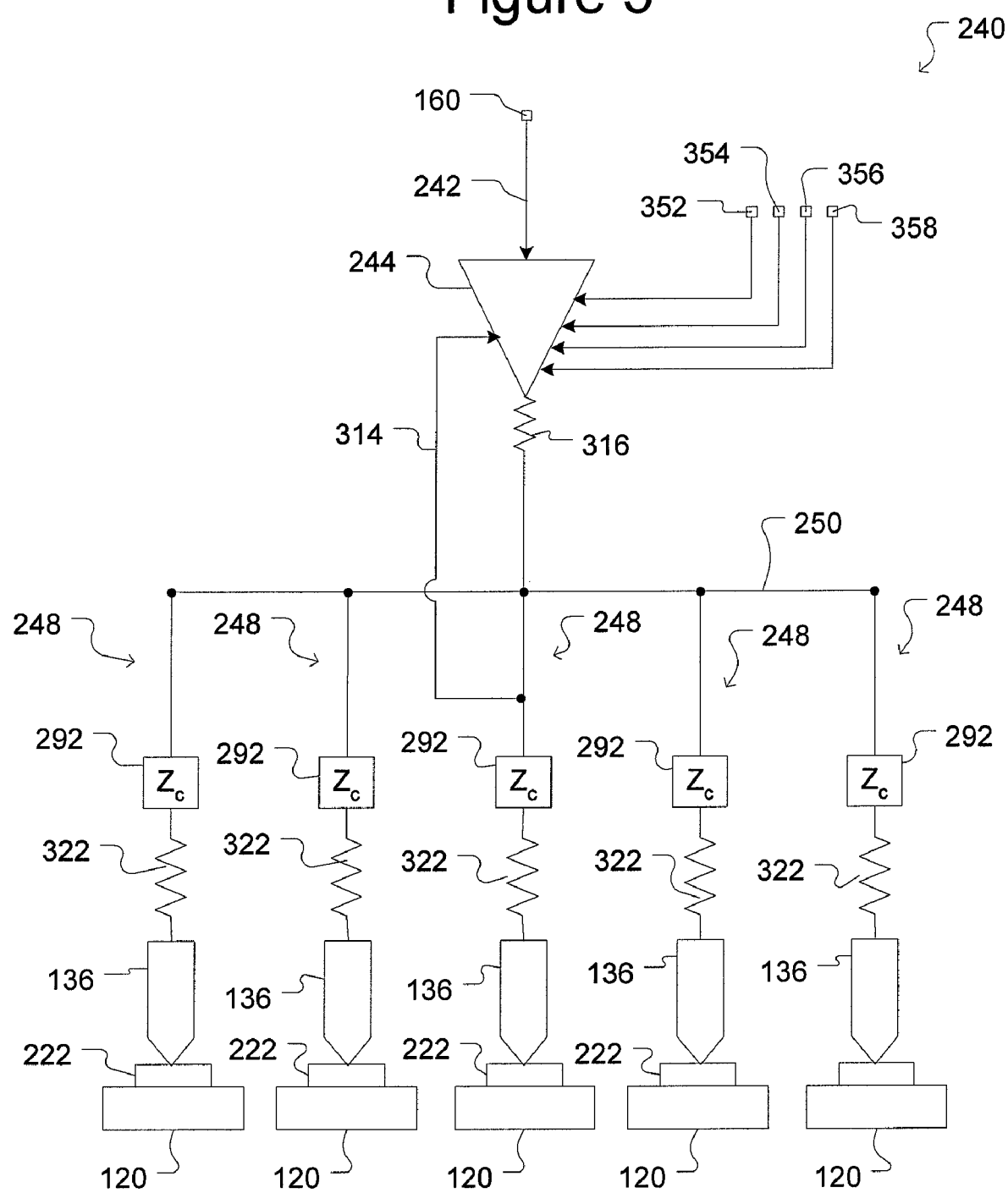
Figure 6:
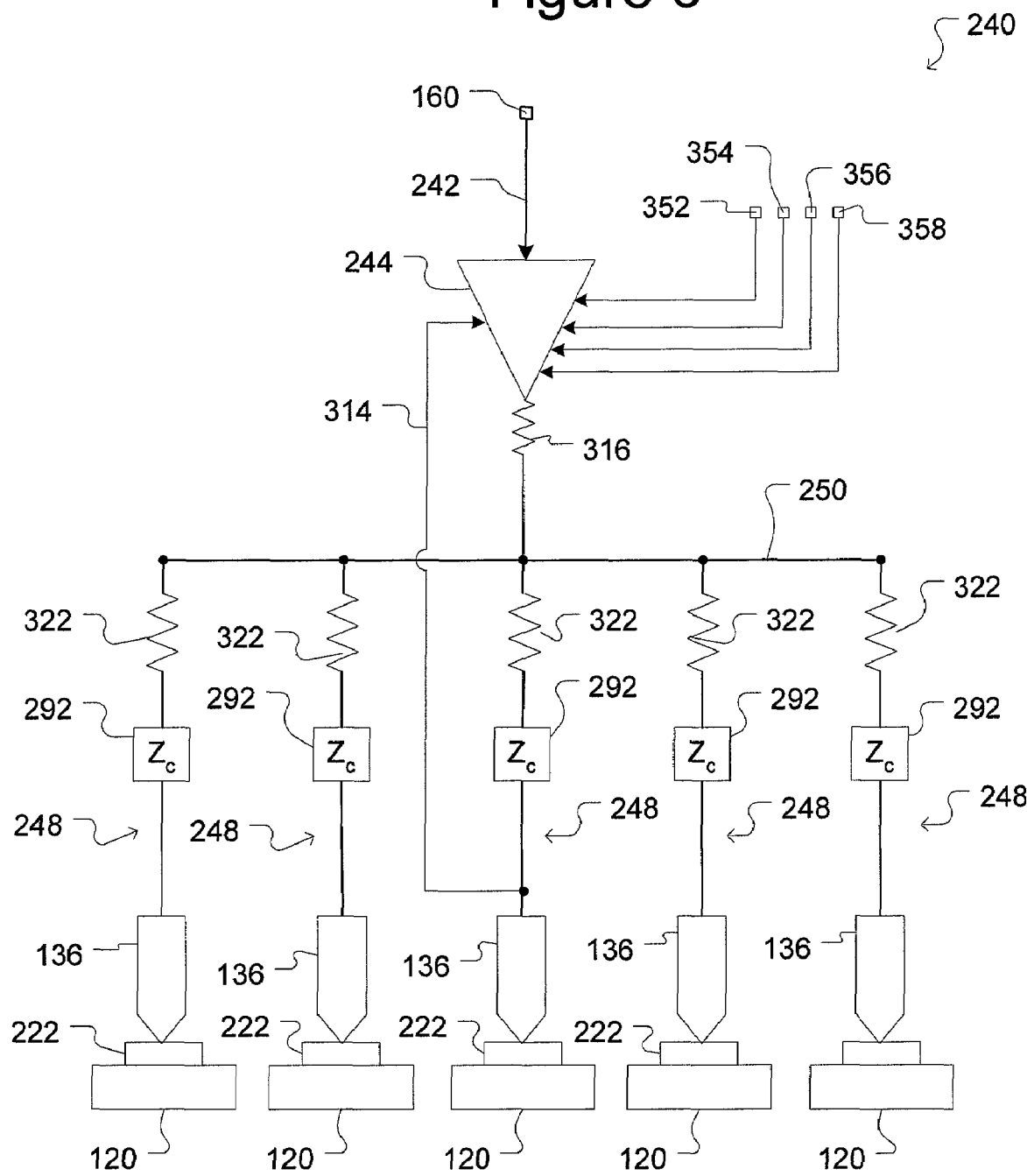

FIGS. 5 and 6 illustrate exemplary configurations of the shared driver module 240 in which the effects of the characteristic impedances $Z_c$ of the transmission lines 248 are considered in selecting the resistance value of the output impedance 316 of the driver 244 and the resistance values of the isolation resistors 322. Like number elements in FIGS. 4-6 can be the same.

In FIG. 5, the isolation resistors 322 can be located at or near the probes 136 and can thus be near the ends of the transmission lines 248. Because terminals 222 can be high impedance (assuming a CMOS or similar DUT 120), transmission lines 248 are effectively terminated in an open circuit condition (unless there is a short-to-ground fault at a terminal 222), and resistors located at or near the ends of the transmission lines 248 will have little to no effect on signals driven down the lines 248 by the driver 244. In the configuration shown in FIG. 5, where the isolation resistors 322 are located at or near the ends of the transmission lines 248, the resistance values of the isolation resistors 322 can be ignored, and the output impedance 316 of the driver 244 can be made or selected to be as follows: $R_o = Z_c/N$, where $R_o$ is the output impedance 316 of the driver 244, $Z_c$ is the characteristic impedance of each transmission line 248, N is the total number of transmission lines 248, and * means multiplication. (The foregoing assumes that the characteristic impedance $Z_c$ of each transmission line 248 is the same or approximately the same.)

In FIG. 6, the isolation resistors 322 are not located at or near the probes 136 and are thus not near the ends of the transmission lines 248. The resistance of the resistors 322 are therefore taken into account in sizing the output impedance 316 of the driver 244. Thus, in the configuration shown in FIG. 6, where the isolation resistors 322 are not located at or near the ends of the transmission lines 248, the output impedance 316 of the driver 244 can be made or selected to be as follows: $R_o = (R + Z_c)/N$, where $R_o$ is the output impedance 316 of the driver 244, R is the resistance value of each resistor 322, $Z_c$ is the characteristic impedance of each transmission line 248, N is the total number of transmission lines 248, and * means multiplication. (The foregoing assumes that the characteristic impedance $Z_c$ of each transmission line 248 is the same or approximately the same and the resistance of each isolation resistor 322 is the same or approximately the same.)

Referring again to FIG. 3, each power supply module 210 shown in FIG. 3 can provide power through ones of probes 136 to power terminals 224 (which, as discussed above, can be a subset of the terminals 118 of the DUTs 120). As shown in FIG. 3, each power supply module 210 can include a power input 280 through which power can be provided. Power inputs 280 can be electrically connected to a single supply of power such that one source of power (not shown) provides power to each of the power supply modules 210. Alternatively, a separate source of power (not shown) can be connected to each power input 280. As still another alternative, each of a plurality of sources of power (not shown) can be connected to more than one but less than all of the power inputs 280. The source or sources of power (not shown) can be located in the tester 102 and can be connected to inputs 280 through ones of communications channels 180 (see FIG. 2). Alternatively, the source or sources of power (not shown) can be located on the probe card assembly 134 or can be located elsewhere.

As also shown in FIG. 3, each power supply module 210 can include an input/output ("I/O") interface 214 for signals such as control signals, data signals, status signals, etc. I/O interface 214 can be electrically connected through connector 160 to communications channels 180. (See FIG. 2.) Power supply modules 210 can thus be controlled by tester 102. Alternatively, I/O interface 214 can be electrically connected to another electronic apparatus. As yet another alternative, I/O interface 214 can be electrically connected in part to tester 102 (through connector 160 and communications channels 180) and in part to one or more other electronic apparatuses.

Figure 7:
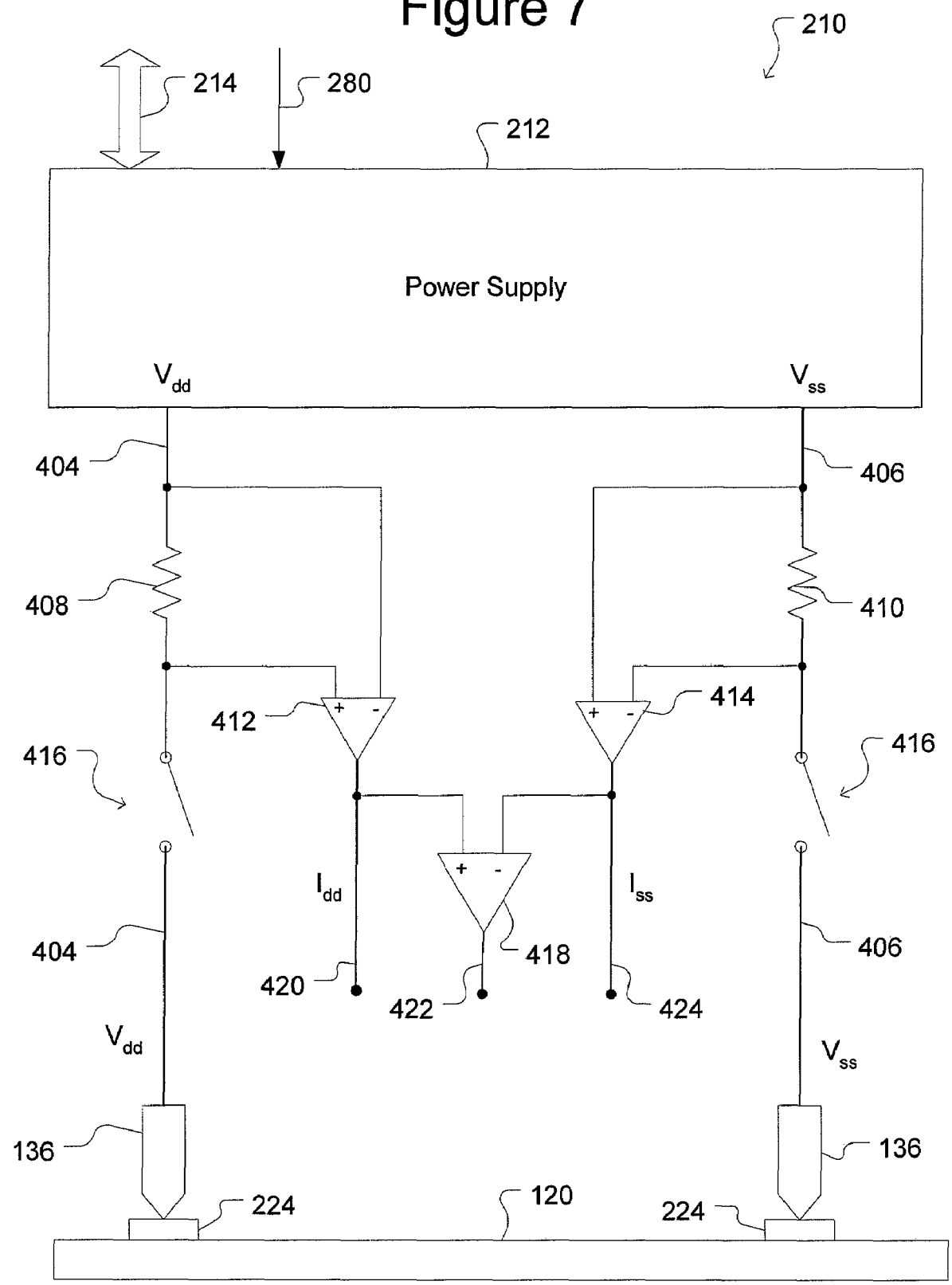
FIG. 7 illustrates an exemplary configuration of a power supply module according to some embodiments of the invention.

FIG. 7 illustrates an exemplary configuration of a power supply module 210 according to some embodiments of the invention. As shown, power supply module 210 can comprise a power supply 212 for supplying power to a first power terminal 224 of a DUT 120. A first voltage can be output through a first power line 404 that is terminated in a probe 136 configured to contact the first power terminal 224 on a DUT 120, and a second voltage can be output through a second power line 406 that is terminated in a probe 136 configured to contact a second power terminal 224 of the DUT 120. For example, the first power line 404 can provide a positive voltage (e.g., five volts), and the second power line 406 can provide ground (e.g., zero volts). As shown in FIG. 7, if DUT 120 is a CMOS-type DUT, the first power line 404 can provide a biasing voltage ($V_{dd}$) for the drain of CMOS transistors on DUT 120, and the second power line 406 can provide a biasing voltage ($V_{ss}$) for the source of CMOS transistors on DUT 120.

As also shown, power supply module 210 can include a differential amplifier 412 having inputs connected to either side of a resistor 408 in the first power line 404. Differential amplifier 412 can thus sense and amplify the voltage drop across resistor 408, which as known, is proportional to the current flowing through resistor 408. The output 420 of differential amplifier 412 is thus proportional to the current flowing through the first power line 404 of power supply 212. As discussed above, if the DUT 120 is a CMOS-type DUT, the current flowing through the first power line 404 can be $I_{dd}$. As also shown in FIG. 7, the inputs of another differential amplifier 414 can be similarly connected to either side of a resistor 410 in the second power line 406. Differential amplifier 414 can thus sense and amplify the voltage drop across resistor 410, which is proportional to the current flowing through resistor 410. The output 424 of differential amplifier 414 is thus proportional to the current flowing through the second power line 406 of the power supply 212. For a CMOS implementation of DUT 120, the current flowing through the second power line 406 can be $I_{ss}$. As also shown in FIG. 7, the outputs 420, 424 of differential amplifiers 412, 414 can be input into a differential amplifier 418, which thus outputs 422 a signal that is proportional to the difference of the current output by the power supply 212 through the first power line 404 and returned by the second power line 406. That is, the output 422 of the differential amplifier 418 can be the difference between the magnitude of the current flowing in the first power line 404 and the magnitude of the current flowing in the second power line 406. In a CMOS implementation of DUTs 120, output 422 can be the difference of the magnitudes of $I_{dd}$ and $I_{ss}$, which will be approximately equal unless leakage current is flowing from the power suppler 212 into an input and/or output terminal 222 of one of the DUTs 120 (terminals 222 are shown in FIG. 3 but not FIG. 7), in which case the difference of the magnitudes of $I_{dd}$ and $I_{ss}$, is approximately equal to the leakage current.

As shown in FIG. 7, switches 416 can be provided in the first power line 404 and the second power line 406 to allow probes 136 to be disconnected from the power supply 212. Switches 416 can be used to, among other things, disconnect a DUT 120 that has failed a portion of the testing (e.g., a DUT 120 at which a fault has been detected) from the power supply 212 during further testing of other DUTs 120. Indeed, although the invention is not so limited, if a separate power supply module 210 is provided for each DUT 120, the power to a failed DUT 120 can be turned off, which can reduce or eliminate heat that the failed DUT 120 might otherwise generate and can reduce or eliminate effects the failed DUT 120 might have on other DUTs 120 driven by the same driver 244 (see FIG. 4) that drives the failed DUT 120. Thus, by disconnecting the power supply connections from a failed DUT 120, faults on the power connections to the failed DUT 120 can be isolated. Control signals can be provided through I/O interface 214 to open and close switches 416, and data signals through I/O interface 214 can provide the current state (open or closed) of switches 416 to another electronic component (e.g., tester 102 of FIGS. 1 and 2).

Figure 8:
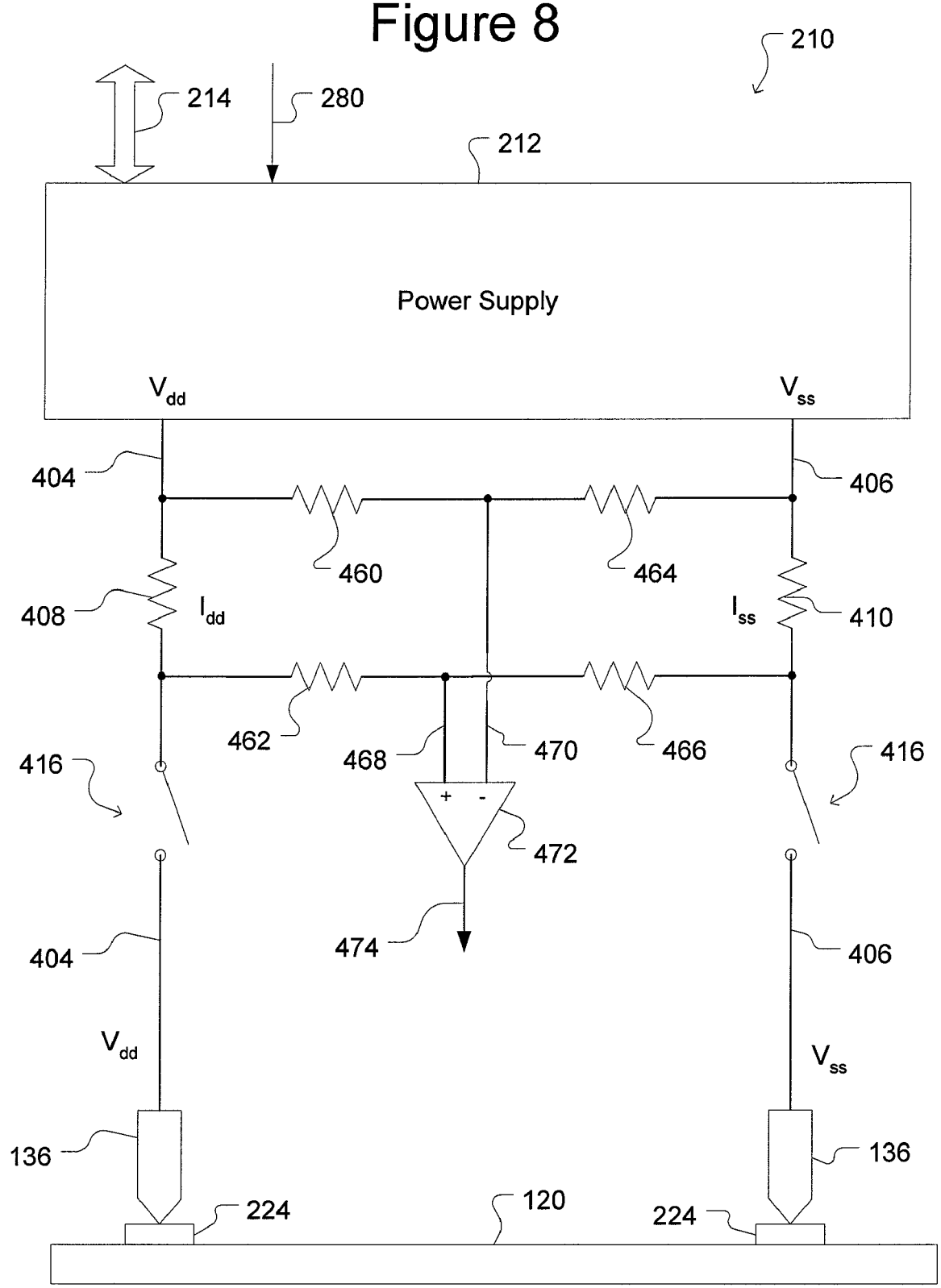
FIG. 8 illustrates another exemplary configuration of a power supply module according to some embodiments of the invention.

FIG. 8 illustrates another exemplary configuration of the power supply modules 210 of FIG. 3 according to some embodiments of the invention. Several of the elements of the configuration of the power supply module 210 of FIG. 8 can be the same as or similar to and can be configured the same as or similar to elements in configuration of FIG. 7. Indeed, like numbered elements in FIGS. 7 and 8 can be the same or similar.

As shown, the exemplary configuration of the power supply module 210 shown in FIG. 8 can include a differential amplifier 472 (which can be like any of differential amplifiers 412, 414, 418). One of the inputs 470 of the differential amplifier 472 can be connected between resistor 460 and resistor 464. As shown, resistor 460 can be electrically connected to the first power line 404 on the power-supply side of the resistor 408 in the first power line 404, and the resistor 464 can be electrically connected to the second power line 406 on the power-supply side of the resistor 410 in the second power line 406, as shown in FIG. 8. Another of the inputs 468 of the differential amplifier 472 can be connected between resistor 462 and resistor 466. As shown, resistor 462 can be electrically connected to the first power line 404 on the probe side of the resistor 408 in the first power line 404, and the resistor 466 can be electrically connected to the second power line 406 on the probe side of the resistor 410 in the second power line 406, as also shown in FIG. 8. If resistors 408 and 410 are approximately equal in resistance value and resistors 460, 462, 464, 466 are approximately equal in resistance value, the output 474 of the differential amplifier 472 can be approximately proportional to leakage current flowing into an input terminal 222 of DUT 120 (terminals 222 are shown in FIG. 3 but omitted from FIG. 8). For example, absent such a leakage current, the magnitudes of the current $I_{dd}$ output by and the current $I_{ss}$ returned to the power supply 212 should be approximately equal. Consequently, if resistors 408 and 410 are approximately equal in resistance value and resistors 460, 462, 464, 466 are approximately equal in resistance value, the voltages at the inputs 468 and 470 of the differential amplifier 472 should be approximately equal, in which case, the output 474 of the differential amplifier should be approximately zero. A lack of equality of the magnitudes of current $I_{dd}$ and current $I_{ss}$ should be proportional to leakage current from the power supply 212 into a signal terminal 222 (see FIG. 3) of one of the DUTs 120 (see FIG. 3) and should result in a difference in the voltages at the inputs 468, 470 of the differential amplifier 472.

According to some embodiments, resistors 408 and 410 can be selected to have a relatively low resistance value so that the voltage drop across resistors 408, 410—which contributes to the voltage drop from the power supply 212 to the probes 136—is negligible for the particular testing application in which the power supply module 210 is used. On the other hand, the resistors 460, 462, 464, 466 can be selected to have a relatively high resistance value so that the current drawn from the first power line 404 and the second power line 406 has a negligible effect on the testing of the DUT 120. In one non-limiting exemplary embodiment, resistors 408, 410 can be selected to be one ohm resistors, and resistors 460, 462, 464, 468 can be selected to be one thousand ohm resistors. In other embodiments, other values of resistance can be selected for resistors 408, 410 and resistors 460, 462, 464, 468.

One or more of resistors 460, 462, 464, 466 can be variable resistors. Configured with one or more of resistors 460, 462, 464, 466 as variable resistors, the power supply module 210 of FIG. 8 can be calibrated by connecting probes 136 in a configuration known not to drawn leakage current from the power supply 212. The resistance of one or more of resistors 460, 462, 464, 466 that are variable resistors can then be adjusted until the output 474 of the differential amplifier 472 is zero or approximately zero. The foregoing calibration procedure can also be used to compensate for tolerance values in any of the components of the power supply module 210 or to provide an off set.

Figure 9:
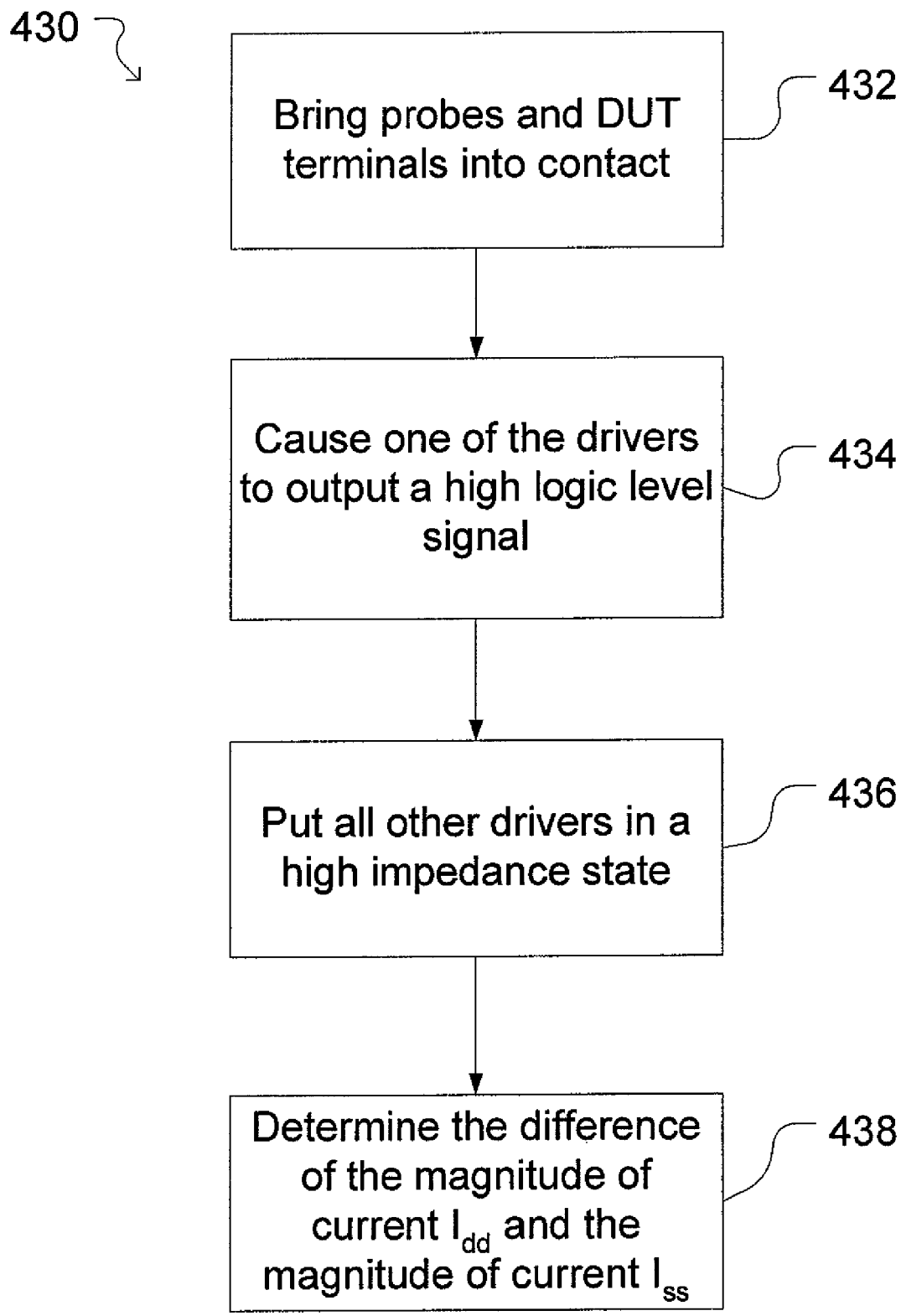
FIG. 9 illustrates an exemplary process for measuring leakage current at a DUT terminal according to some embodiments of the invention.
Figure 10:
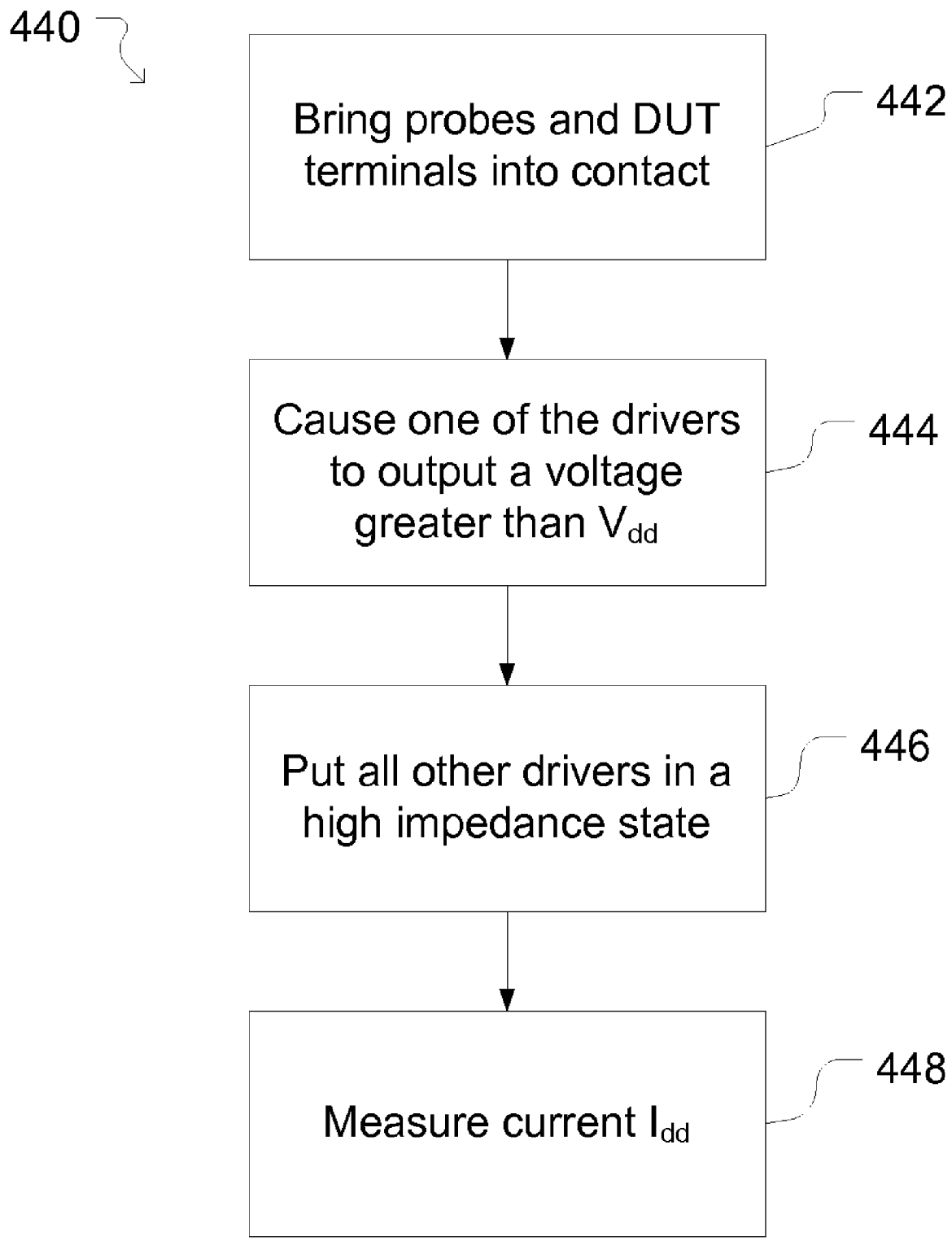
FIG. 10 illustrates an exemplary process for testing a device under test or DUT terminal for an open circuit fault according to some embodiments of the invention.
Figure 11:
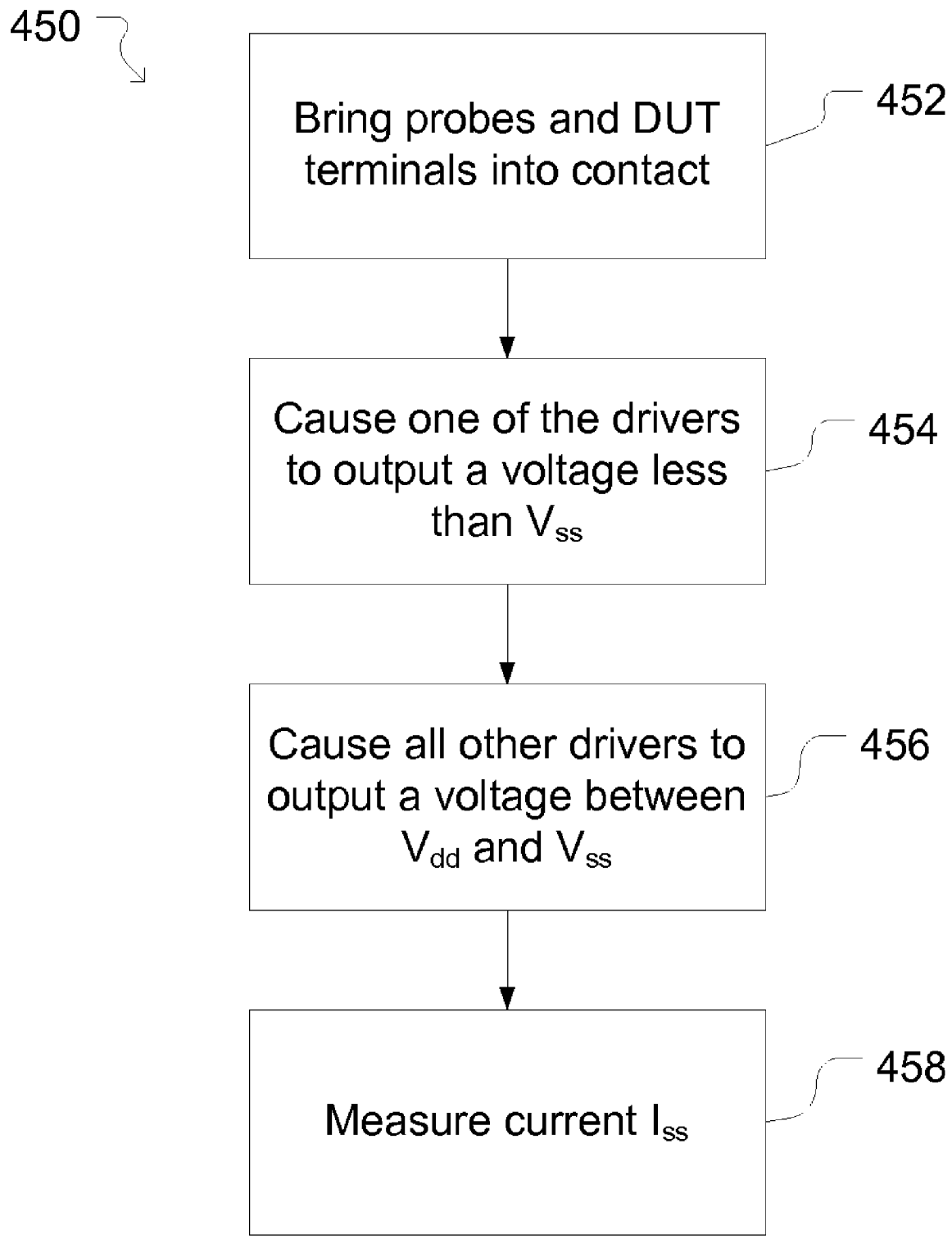
FIG. 11 illustrates an exemplary process for testing a DUT terminal for a short circuit fault according to some embodiments of the invention.

FIGS. 9-11 illustrate exemplary processes for performing various DC tests on DUTs, like DUTs 120, according to some embodiments of the invention. For purposes of discussion and illustration, the processes shown in FIGS. 9-11 are discussed below as carried out using the shared driver block 152 and power supplies block 154 configurations shown in FIG. 3. Also for purposes of discussion and illustration, DUTs 120 are assumed to by CMOS-type DUTs. Nevertheless, the processes shown in FIGS. 9-11 can be carried out using other implementations of shared drivers block 152 and power supplies block 154 and on DUTs that are not CMOS-type DUTs.

FIG. 9 illustrates an exemplary process 430 for determining the leakage current of an input terminal 222 on each of a plurality of DUTs 120. For example, process 430 can be used to determine the leakage current of one of the input terminals 222 on each of DUTS 120 in FIG. 3. As shown in FIG. 9, at 432, probes 136 can be brought into contact with terminals 222, 224 of DUTs 120, as generally shown in FIG. 3. As discussed above, the shared driver modules 240 and power supply modules 210 shown in FIG. 3 can be disposed on a probe card assembly, like the probe card assembly 134 shown in FIGS. 1 and 2. Thus, 432 can be accomplished by placing DUTs 120 on a stage 130 in a test system like test system 100 (see FIG. 1) and moving the DUTs 120 into contact with probes 136 of probe card assembly 134.

Referring again to FIGS. 3 and 9, at 434, one of the drivers 244 can output a high logic level signal so that all of the probes 136 driven by that driver 244—and thus one input terminal 222 on each DUT 120—an be driven to a high logic level. The other drivers 244, which can be tri-state drivers, can be put into a high impedance state at 436. Thus, after 432, 434, and 436 in FIG. 9, one input terminal 222 on each of DUTs 120 in FIG. 3 is driven to a high logic level, while other input terminals 222 on each DUT can be put into a high impedance state. Note that power supply modules 210 contact power terminals 224 and thus supply power to DUTs 120.

The difference in the magnitudes of the currents flowing through the power lines 404, 406 in each power supply 212 to its DUT can then be determined at 438. As discussed above with respect to FIG. 7 (or FIG. 8), the current difference determined at 438 is the leakage current of the terminal 222 on the DUT 120 that was driven to a high logic level at 434 (see FIG. 9). The leakage current for a particular input terminal 222 on a DUT 120 can thus be determined by driving the terminal 222 to a high logic level (434 in FIG. 9), putting the other input terminals 222 into a high impedance state (436 in FIG. 9), and determining the difference in the magnitudes of the currents flowing from the power supply 212 of the power supply module 210 connected to the power terminals 224 of the DUT (438 in FIG. 9).

With reference to FIGS. 7 and 8, the difference in the magnitudes of the currents flowing from the power supply 212 can be the difference in the currents flowing through the first power line 404 and the second power line 406 in the power supply 212. As discussed above with respect to FIG. 7, the output 422 of differential amplifier 418 is proportional to the difference in the magnitudes of the currents flowing through the first power line 404 and second power line 406 of the power supply 212, and absent leakage current flowing into a signal terminal 222 of a DUT 120, that difference should be zero or approximately zero. That is, if current is drawn only by the power terminals 224 of the DUT 120, the magnitudes of the currents flowing through the first power line 404 and the second power line 406 should be equal or approximately equal. Any difference in the magnitudes of the currents should be due to leakage current into signal terminals 222 of the DUT 120. The output 422 of differential amplifier 418 is therefore proportional to the leakage current. Similarly, as discussed above with respect to FIG. 8, the output 474 of differential amplifier 472 in FIG. 8 is proportional to the difference in the magnitudes of the currents flowing through the first power line 404 and second power line 406 of the power supply 212, and absent leakage current flowing into a signal terminal 222 of a DUT 120, that difference should be zero or approximately zero.

The process of FIG. 9 can be repeated until a leakage current is measured for each of the input terminals 222 on each of DUTs 120. It should be noted that in some configurations, more than one power supply module (e.g., like power supply module 210) can provide power to one DUT 120. In such a case, each power supply module can be configured, like power supply module 210, to measure a difference between the currents output by each output of the power supply (e.g., like power supply 212) of the power supply module. The difference in the currents flowing in the terminals of each power supply is the leakage current into signal terminals of the DUT. It is also possible to drive more than one signal terminal of a DUT at the same time and thus measure the total leakage current into all of the driven signal terminals, which is sometimes referred to as a "ganged" measurement.

Process 430 is exemplary only and modifications and alternatives are possible. For example, rather than measuring the leakage current of individual input terminals 222 of DUTs 120, as described in the above description of process 430, the combined leakage current of all of the input terminals 222 of each DUT 120 can be determined using the process 430 of FIG. 9. To do so, at 434, all drivers 244 can output a signal corresponding to a high logic level so that all of the input terminals 222 on a DUT 120 are driven to a high logic level and 436 can be skipped. In such a case, the current difference determined at 438 for each DUT 120 is the combined leakage currents of all of the input terminals 222 of the DUT 120.

FIG. 10 illustrates an exemplary process 440 for testing an input terminal 222 on each of DUTs 120 (see FIG. 3) for an open circuit fault condition according to some embodiments of the invention. (In an open circuit fault condition, terminal 222 is not properly connected electrically to the internal circuitry of DUT 120.) As shown in FIG. 10, at 442, probes 136 can be brought into contact with DUTs 120, as generally shown in FIG. 3. 442 can be similar to 432 of FIG. 9 and can be accomplished in the same or similar manner.

Referring to FIGS. 3, 7, and 10, at 444 of FIG. 10, one of the drivers 244 can output a voltage level that is greater than $V_{dd}$ (the voltage output by a power supply through its first power line 404 (see FIG. 5)). Each probe 136 connected to that driver 244 can thus be also driven to a voltage level that is greater than $V_{dd}$. At 446 of FIG. 10, all other drivers 244 can be put into a high impedance state. 446 can be similar to 436 of FIG. 9 and can be accomplished in the same or similar manner. Thus, after 444 and 446, one input terminal 222 on each DUT 120 is driven to voltage level that is greater than $V_{dd}$, and the other input terminals 222 on each DUT 120 can be put into a high impedance state. Power supply modules 210 contact power terminals 224 and thus supply power to DUTs 120. A diode (not shown) in the electrostatic discharge protection ("ESD") circuit (not shown) in the input terminal 222 to which a voltage greater than $V_{dd}$ is applied is now forward biased and should conduct current $I_{dd}$ from the first power line 404 of power supply 212 (see FIG. 7).

At 448 of FIG. 10, the current $I_{dd}$ output by each power supply 212 is determined. As shown in FIG. 7, the output 420 of the differential amplifier 412 on each power supply module 210 is proportional to $I_{dd}$. Due to the forward biasing of the ESD diode as discussed above, current $I_{dd}$ should be drawn from the power supply 212. If such a current is detected at step 448, the input terminal 222 driven to a voltage greater than $V_{dd}$ does not have an open circuit fault. If, on the other hand, no current or only a negligible level of current $I_{dd}$ is detected at 448, the terminal 222 driven to a voltage greater than $V_{dd}$ has an open circuit fault. The process 440 of FIG. 10 can be repeated until all of the input terminals 222 on each DUT 120 have been tested for an open circuit fault condition.

Process 440 is exemplary only, and modifications and alternatives are possible. For example, at 444, the driver 244 can output a voltage that is less than $V_{ss}$ (as opposed to being greater than $V_{dd}$). In such a case, the flow of current $I_{ss}$ (rather than $I_{dd}$) can be detected at 448. As shown in FIG. 7, the output 424 of the differential amplifier 414 on each power supply module 210 is proportional to $I_{ss}$. Again, the presence of a significant current $I_{ss}$ indicates no open circuit fault at the terminal 222 driven to a voltage that is less than $V_{ss}$, and the absence of current $I_{ss}$ or the flow of only a negligible amount of current $I_{ss}$ indicates an open circuit fault at the terminal 222.

FIG. 11 illustrates an exemplary process 450 for testing an input terminal 222 on each of DUTs 120 (see FIG. 3) for a short circuit fault condition according to some embodiments of the invention. (In a short circuit fault condition, terminal 222 is shorted to another terminal of the DUT 120.) As shown in FIG. 11, at 452, probes 136 can be brought into contact with DUTs 120. 452 can be similar to 432 of FIG. 9 and can be accomplished in the same or similar manner. At 454, one of the drivers 244 outputs a voltage level that is less than $V_{ss}$ (the voltage output by a power supply 212 onto the second power line 406 (see FIG. 7)). For example, assuming $V_{dd}$ is about four volts and $V_{ss}$ is ground (zero volts), the driver 244 can output a voltage that is about negative two volts. Each probe 136 driven by that driver 244 is thus also driven to that voltage level. At 456, all other drivers 244 can output a voltage that is between $V_{dd}$ (the voltage out by a power supply 212 onto the first power line 404 (see FIG. 7)) and $V_{ss}$. For example, again assuming $V_{dd}$ is about four volts and $V_{ss}$ is ground (zero volts), the other drivers 244 can output a voltage that is about two volts. Thus, after 454 and 456 in the process 450, one input terminal 222 on each DUT 120 is driven to a voltage level that is less than $V_{ss}$ (e.g., about negative two volts), and the other input terminals 222 on each DUT 120 can be driven to a voltage that is between $V_{dd}$ and $V_{ss}$ (e.g., about two volts). Next, the current $I_{ss}$ output by each power supply 212 through its second power line 406 (see FIG. 7) is determined at 458. As shown in FIG. 7 and discussed above, the output 424 of the differential amplifier 414 on each power supply module 210 (see FIG. 3) is proportional to $I_{ss}$. If there is a short circuit fault at the terminal 222 driven to a voltage that is less than $V_{ss}$ by being connected to a terminal 222 driven above $V_{ss}$, no current $I_{ss}$ or only a negligible amount of current $I_{ss}$ will be drawn from the power supply 212 connected to that terminal's DUT 120. If there is not a short circuit fault at the terminal driven to a voltage that is less than $V_{ss}$, a significant amount (e.g., anything more than a negligible amount) of current $I_{ss}$ will be drawn from the power supply 212 connected to the terminal's DUT 120. The process 450 of FIG. 11 can be repeated until all of the input terminals 222 on each DUT 120 (see FIG. 3) have been tested for a short circuit fault condition.

The process 450 shown in FIG. 11 is exemplary only, and modifications and variations are possible. For example, at 454 the driver 244 can output a voltage that is greater than $V_{dd}$ (e.g., six volts, again assuming $V_{dd}$ is about four volts and $V_{ss}$ is ground (zero volts)). In such a case, the flow of current $I_{dd}$ (rather than $I_{ss}$) can be detected at 458. As shown in FIG. 7, the output 420 of the differential amplifier 412 on each power supply module 210 (see FIG. 3) is proportional to $I_{dd}$. Again, the presence of a significant current $I_{dd}$ indicates no short circuit fault at the terminal 222 driven to a voltage that is greater than $V_{dd}$, and the absence of current $I_{dd}$ or the flow of only a negligible amount of current $I_{dd}$ indicates a short circuit fault at that terminal 222.

Figure 12:
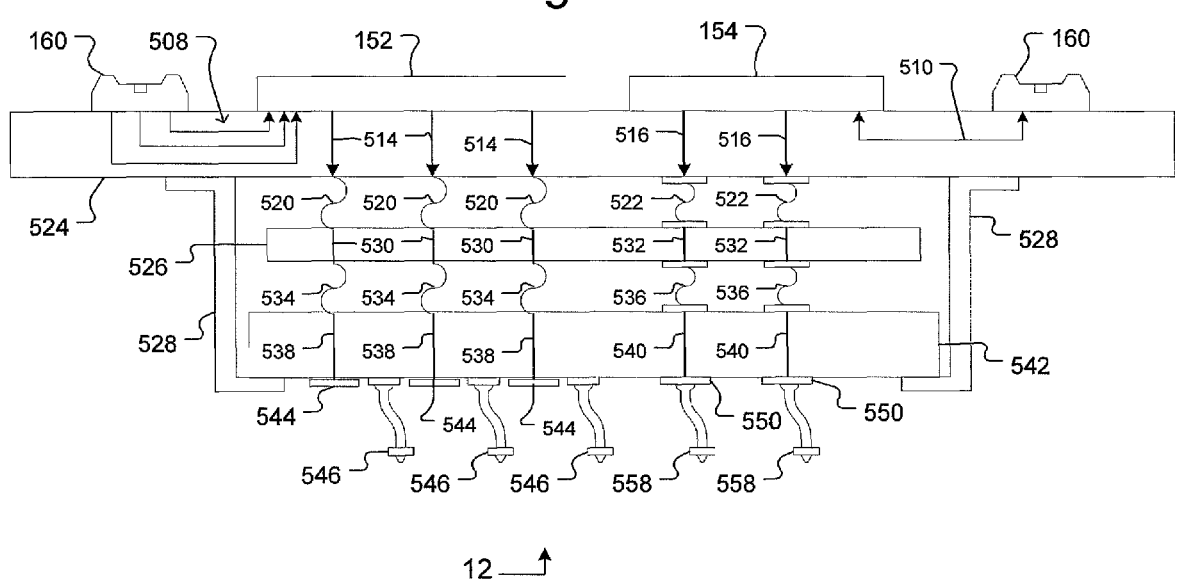
FIG. 12 illustrates a side view of an exemplary probe card assembly according to some embodiments of the invention.
Figure 13:
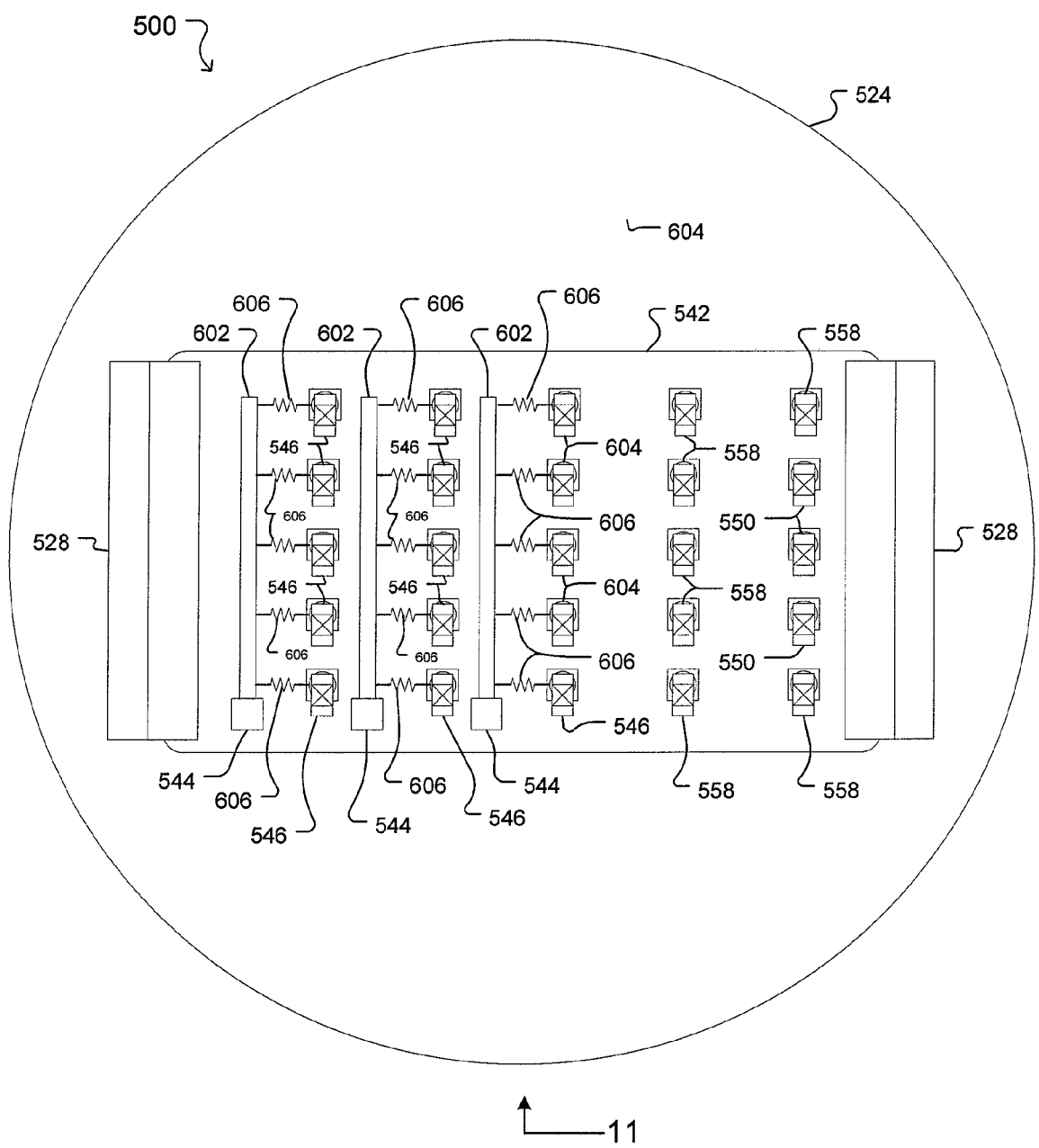
FIG. 13 illustrates a bottom view of the probe card assembly of FIG. 12.

As discussed above with respect to FIG. 3, the shared drivers block 152, comprising shared driver modules 240, and the power supply block 154, comprising the power supply modules 210, can be located on a probe card assembly, like probe card assembly 134. FIGS. 12 and 13 illustrate exemplary implementation of shared driver modules 240 and power supply modules 210 of FIG. 3 on a probe card assembly 500 according to some embodiments of the invention. Probe card assembly 500 can be implemented in a test system, like test system 100 of FIG. 1, and is illustrated in FIG. 12 as having connectors 160, which as described above and illustrated in FIG. 2, can connect to communications channels 180 from a tester 102.

As shown in FIGS. 12 and 13, probe card assembly 500 can include a wiring board 524, an interposer 526, and a probe substrate 542 held together by brackets 528 or other suitable means. Each of the wiring board 524, interposer 526, and probe substrate 542 can comprise any suitable substrates including without limitation a printed circuit board, a ceramic substrate, an organic substrate, etc. Connectors 160, as discussed above, can provide electrical connections to communications channels 180 to and from a tester 102 (see FIG. 2). Probes 546 and 558, which can be like probes 136, can be attached to the probe substrate 542 in a pattern that corresponds to terminals of DUTs 120. As will be seen, probes 546 can be configured to contact input terminals of DUTs 120, and probes 558 can be configured to contact power terminals (e.g., power and ground, or $V_{dd}$ and $V_{ss}$, etc.) of DUTs 120. Other probes (not shown) can also be attached to the probe substrate 542 and configured to contact other terminals (not shown) of DUTs (e.g., like DUTs 120) including output terminals (not shown), additional input terminals (not shown), and additional power terminals (not shown).

The probe card assembly 500 illustrated in FIGS. 12 and 13 is exemplary only and many alternative and different configurations of a probe card assembly 500 may be used. For example, a probe card assembly 500 may include fewer or more substrates (e.g., 524, 526, 542) than the probe card assembly shown in FIG. 12. As another example, the probe card assembly may include more than one probe substrate (e.g., 542), and each such probe substrate can be independently adjustable. Non-limiting examples of probe card assemblies with multiple probe substrates are disclosed in U.S. patent application Ser. No. 11/165,833, filed Jun. 24, 2005. Additional non-limiting examples of probe card assemblies are illustrated in U.S. Pat. Nos. 5,974,662 and 6,509,751 and the aforementioned U.S. patent application Ser. No. 11/165,833, filed Jun. 24, 2005, and various features of the probe card assemblies described in those patents and application may be implemented in the probe card assembly 500 show in FIG. 12.

As shown in FIG. 12, a shared drivers block 152 and a power supply block 154 can be disposed on the probe card assembly 500. Shared drivers block 152 and power supply block 154 can comprise one or more electronic components (e.g., integrated circuit "chips," resistors, capacitors, etc.). Although shared drivers block 152 and power supply block 154 are shown in FIG. 12 disposed on the wiring board 524, shared drivers block 152 and power supply block 154 can be disposed on the interposer 526, the probe substrate 542, or distributed on two or more of the wiring board 524, the interposer 526, and the probe substrate 542.

Each of the shared driver modules 240 shown in FIG. 3 can be implemented in the probe card assembly 500 of FIGS. 12 and 13 as follows. As shown in FIG. 12, electrical connections 508 (e.g., electrically conductive traces and/or vias) on and/or within wiring board 524 can provide electrical connections between connectors 160 (and thus communications channels 180 (see FIG. 2) from tester 102) to shared drivers block 152. Although three electrical connections 508 are shown, more or fewer can be implemented. Electrical connections 508 can provide inputs to shared drivers block 152. For example, electrical connections 508 can provide the input 242 and the control signals 352, 354, 356, 358 shown in FIG. 4.

Electrical connections 514 (e.g., conductive traces and/or vias) on and/or within wiring board 524 can provide electrical connections from outputs of shared drivers block 152 to electrically conductive spring contacts 520, which can provide electrical connections between the wiring board 524 and the interposer 526. Electrical connections 530 (e.g., conductive traces and/or vias) on and/or within interposer 526 can provide electrical connections from spring contacts 520 to electrically conductive spring contacts 534, which can provide electrical connections between the interposer 526 and the probe substrate 542. Electrical connections 538 (e.g., conductive traces and/or vias) on and/or within probe substrate 542 can provide electrical connections between spring contacts 534 and conductive pads 544, which can be disposed on a bottom surface of the probe substrate 542. Electrical connections 514, spring contacts 520, electrical connections 530, spring contacts 534, and electrical connections 538 thus provide a plurality of conductive paths from shared drivers block 152 to pads 544.

As shown in FIG. 13, pads 544 can be electrically connected to conductive traces 602, which can also be disposed on the bottom surface of probe substrate 542. As can also be seen in FIG. 13, resistors 606 can electrically connect each probe 546 to one of the traces 602. Resistors 606 can be discrete resistors, thin film resistors, or any other type of resistor. As another example, resistors 606 can be like the resistors U.S. Pat. Nos. 6,603,323; 6,784,674; 6,798,225 and 6,965,248.

Thus, drivers 244 of FIG. 3 can be implemented in circuitry of shared drivers block 152 in FIG. 12. Moreover, resistors 606 can implement transmission lines 248 and isolation resistors 322 in FIG. 3. Probes 546 in FIGS. 12 and 13 can implement ones of probes 136 in FIG. 3.

Referring again to FIG. 12, each of the power supply modules 210 shown in FIG. 3 can be implemented on the probe card assembly 500 of FIGS. 12 and 13 as follows. One or more electrical connections 510, (e.g., conductive traces and/or vias) on or within wiring board 524 can implement the I/O interface 214 and power inputs 280. As shown, electrical connection 510 electrically connects power supplies block 154 with connector 160, which as discussed above, is connected to communications channels 180 to the tester (see FIG. 2). Alternatively, electrical connection 510, can provide electrical connections to an electronic component other than the tester 102 or can provide electrical connections to the tester and one or more other electronic components. Although one electrical connection 510, is shown, more can be used.

Electrical connections 516 (e.g., traces and/or vias) on or within wiring board 524 provide outputs for power supplies block 154 and can be electrically connected to conductive spring contacts 522, which can be electrically connected to electrical connections 532 (e.g., traces and/or vias) through interposer 526, which can be electrically connected to conductive spring contacts 536, which can be electrically connected to electrical connections 540 (e.g., traces and/or vias) through probe substrate 542, which can be connected to pads 550 and power probes 558. Electrical connections 516, spring contacts 522, electrical connections 532, spring contacts 536, and electrical connections 540 thus form first power lines 404 and second power lines 406 from the power supplies 212 implemented in power supplies block 154 to probes 558. As mentioned above, each of probes 558 is configured to contact a power terminal of a DUT 120.

Referring to FIG. 7, the resistors 408, 410, differential amplifiers 412, 414, 418 and switches 416 of each power supply module 410 can be implemented in power supplies block 154. Similarly, the resistors 408, 410, 460, 462, 466, differentia amplifier 472, and switches 416 in the configuration of FIG. 8 can be implemented in power supplies block module 154. Moreover, the electrical paths formed by electrical connections 516, spring contacts 522, electrical connections 532, spring contacts 536, and electrical connections 540 can implement the first power line 404 and the second power line 406 in FIG. 7 or FIG. 8.

Note that, although not shown in FIGS. 12 and 13, the feed back loop 314 of FIG. 4 can be implemented in control circuitry in shared drivers block 152, and conductive paths from pads 544 to the control circuitry in shared drivers block 152 can be provided by electrical connections (e.g., like 538, 530, 514) through probe substrate 542, interposer 526, and wiring substrate 524, and spring contacts (e.g., like 520, 534) between probe substrate 542, interposer 526, and wiring substrate 524.

Although specific embodiments and applications of the invention have been described in this specification, there is no intention that the invention be limited these exemplary embodiments and applications or to the manner in which the exemplary embodiments and applications operate or are described herein. For example, drivers 244 in FIG. 4 can be replaced with buffer circuits.

What is claimed is:

1. A probe card assembly comprising:
   an interface configured to receive from a tester test signals for testing an electronic device;
   probes for contacting a plurality of electronic devices;
   transmission lines having a characteristic impedance and being electrically connected to the probes; and
   electronic driver circuits connected to the interface and each configured to drive one of the test signals through a plurality of the probes via the transmission lines, wherein the one test signal can be provided to more than one of the electronic devices, and wherein an output impedance of each of the driver circuits is less than the characteristic impedance of the transmission lines.

2. The probe card assembly of claim 1 further comprising a plurality of interconnected substrates, wherein the driver circuits are disposed on at least one of the substrates.

3. The probe card assembly of claim 1, wherein the driver circuits are located within about twelve inches of the probes through which the driver circuits drive the test signals.

4. The probe card assembly of claim 1, wherein a wavelength corresponding to a maximum operating frequency of the driver circuits is at least about ten times the distance between the driver circuits and the probes.

5. The probe card assembly of claim 1, wherein:
   the probes are attached to a probe substrate,
   the driver circuits are disposed on a wiring board, and
   the wiring board is connected to the probe substrate.

6. The probe card assembly of claim 1, wherein at least one of the driver circuits drives one test signal received from the tester to a plurality of probes.

7. The probe card assembly of claim 6, wherein the at least one driver circuit drives the one test signal to at least four probes.

8. The probe card assembly of claim 6, wherein the at least one driver circuit drives the one test signal to at least thirty probes.

9. The probe card assembly of claim 6 further comprising a plurality of resistors disposed between the at least one driver circuit and the plurality of probes, wherein the resistors electrically isolate one of the plurality of probes from the others of the plurality of probes.

10. The probe card assembly of claim 9, wherein the output impedance of the at least one driver circuit approximately equals a total effective resistance of the plurality of resistors.

11. The probe card assembly of claim 9, wherein the plurality of resistors are disposed on a probe substrate to which the probes are attached.

12. The probe card assembly of claim 1, wherein the output impedance of at least one of the driver circuits is less than thirty ohms.

13. The probe card assembly of claim 1, wherein the output impedance of at least one of the driver circuits is less than twenty ohms.

14. The probe card assembly of claim 1, wherein the electronic device comprises a plurality of semiconductor dies composing an unsingulated semiconductor wafer.

15. The probe card assembly of claim 1, wherein the output impedance of at least one of the driver circuits is less than ten ohms.

16. The probe card assembly of claim 1, wherein the output impedance of at least one of the driver circuits is less than five ohms.

17. The probe card assembly of claim 1, wherein the output impedance of at least one of the driver circuits is less than one ohm.

18. The probe card assembly of claim 1, wherein a wavelength corresponding to a maximum operating frequency of the driver circuits is at least about five times the distance between the driver circuits and the probes.

* * * * *